(12) United States Patent
Lee

(10) Patent No.: US 6,226,179 B1
(45) Date of Patent: May 1, 2001

(54) MOUNTING STRUCTURE OF A SEMICONDUCTOR DEVICE MODULE FOR A COMPUTER SYSTEM

(75) Inventor: Sung-Bae Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/419,298

(22) Filed: Oct. 15, 1999

(30) Foreign Application Priority Data

Oct. 17, 1998 (KR) .................................................. 98-43526

(51) Int. Cl.[7] ....................................................... H05K 7/20
(52) U.S. Cl. ........................... 361/687; 704/688; 704/690; 704/698; 704/699; 704/700; 704/720; 165/80.2; 165/80.3; 174/16.1; 174/16.3; 257/678; 257/706; 257/707
(58) Field of Search ..................................... 361/687–700, 361/704, 709, 714, 715, 719–721, 816, 818; 257/678, 706, 707, 713–719; 165/80.2–80.4, 18.5; 174/15.1, 15.2, 16.3, 16.1

(56) References Cited

U.S. PATENT DOCUMENTS

| | | |
|---|---|---|
| 4,084,242 | 4/1978 | Conti . |
| 4,658,332 * | 4/1987 | Baker et al. .......................... 361/398 |
| 4,748,495 | 5/1988 | Kucharek . |
| 5,074,799 * | 12/1991 | Rowlette, Sr. .......................... 439/91 |
| 5,287,617 | 2/1994 | Murphy . |
| 5,369,879 | 12/1994 | Goeschel et al. . |
| 5,424,913 * | 6/1995 | Swindler ............................... 361/687 |
| 5,430,609 * | 7/1995 | Kikinis ................................. 361/687 |
| 5,444,298 * | 8/1995 | Schutz ................................. 257/691 |
| 5,473,510 * | 12/1995 | Dozier, II ............................. 361/719 |
| 5,526,229 * | 6/1996 | Wakabayashi et al. .............. 361/702 |
| 5,619,399 * | 4/1997 | Mok ..................................... 361/707 |
| 5,703,753 * | 12/1997 | Mok ..................................... 361/715 |
| 5,705,932 | 1/1998 | Fredrickson . |
| 5,880,930 * | 3/1999 | Wheaton .............................. 361/690 |
| 5,919,359 | 7/1999 | Dahl . |
| 5,926,370 | 3/1999 | Cromwell . |
| 6,058,012 * | 5/2000 | Cooper et al. ....................... 361/704 |
| 6,075,700 * | 6/2000 | Houghton et al. .................... 361/704 |
| 6,084,178 * | 7/2000 | Cromwell ........................... 174/35 R |
| 6,144,559 * | 11/2000 | Johnson et al. ...................... 361/760 |

FOREIGN PATENT DOCUMENTS

| | | | | |
|---|---|---|---|---|
| 279996 * | 8/1988 | (EP) | .............................. | H01L/23/52 |
| 11-273816 * | 10/1999 | (JP) | .............................. | H01R/33/76 |

* cited by examiner

*Primary Examiner*—Leo P. Picard
*Assistant Examiner*—Anatoly Vortman
(74) *Attorney, Agent, or Firm*—Robert E. Bushnell, Esq.

(57) ABSTRACT

A mounting structure for mounting a semiconductor device module in a computer system, comprises a housing for mounting a motherboard having peripheral ports for connecting with various peripheral devices, an opening formed in the housing for allowing the semiconductor device module to be mounted on or detached from the motherboard, a plurality of fasteners positioned between the motherboard and semiconductor device module for fixing the semiconductor device module on the motherboard, each of the fasteners having two end parts being respectively connected with the motherboard and semiconductor device module, and a rear bracket attached to one side of the housing for supporting the peripheral ports and additionally serving as an electromagnetic interference preventer, wherein the rear bracket fuirther includes an extension plate placed beneath the motherboard to face the part ofthe motherboard mounted with the semiconductor device module, and a plurality of bosses formed on the extension plate so as to respectively hold the end parts of the fasteners connected with the motherboard.

20 Claims, 6 Drawing Sheets

MOUNTING STRUCTURE OF A SEMICONDUCTOR DEVICE MODULE FOR A COMPUTER SYSTEM

CLAIM OF PRIORITY

This application makes reference to, incorporates the same herein, and claims all benefits accruing under 35 U.S.C. § 119 from an application entitled MOUNTING STRUCTURE OF SEMICONDUCTOR DEVICE MODULE FOR A COMPUTER SYSTEM earlier filed in the Korean Industrial Property Office on Oct. 17, 1999, and there duly assigned Ser. No. 43526/1998, a copy of which is annexed hereto.

BACKGROUND OF THE INVENTION

1. Technical Field

The present invention concerns a structure for mounting a semiconductor device module in a printed circuit board of a computer system, and more particularly concerns a structure for mounting a semiconductor device module in a motherboard of a computer system.

2. Background of the Invention

Computer systems are information handling systems that are utilized by many individuals and businesses today. A computer system can be defined as a microcomputer that includes a central processing unit (CPU), a volatile memory, a non-volatile memory such as read only memory (ROM), a display monitor, a keyboard, a mouse or other input device such as a trackball, a floppy diskette drive, a compact disc-read only memory (CD-ROM) drive, a modem, a hard disk storage device, and a printer. A computer system's main board, which is a printed circuit board known as a motherboard, is used to electrically connect these components together. A computer system can be a desktop computer, a personal computer, a portable computer such as a notebook computer or palm-sized computer, or other type of computer.

Generally, a semiconductor device module refers to a packaged functional assembly consisting of a cache memory, central processing unit (CPU) and other electronic components mounted on a small printed circuit board (PCB). Such a semiconductor device module requires a particular mounting structure which is different from that used for mounting a standard CPU in the motherboard.

Meanwhile, one of the important factors that must be considered for the mounting structure is the user's upgradablity of the semiconductor device module with the development of the semiconductor technology.

I have found that a replacement of semiconductor device module can be difficult and inconvenient. Efforts have been made to improve coupling an integrated circuit to a printed circuit board.

Exemplars of recent efforts in the art include U.S. Pat. No. 5,926,370 for method and APPARATUS FOR A MODULAR INTEGRATED APPARATUS FOR MULTI-FUNCTION COMPONENTS issued to Cromwell, U.S. Pat. No. 5,919,259 for METHOD AND APPARATUS FOR SUPPLYING POWER TO A CPU USING AN ADAPTOR CARD issued to Dahl, U.S. Pat. No. 5,705,932 for SYSTEM FOR EXPANDING SPACE PROVIDED BY TEST COMPUTER TO TEST MULTIPLE INTEGRATED CIRCUITS SIMULTANEOUSLY issued to Fredrickson, U.S. Pat. No. 5,369,879 for METHOD OF MOUNTING A SEMICONDUCTOR DEVICE TO A HEAT SINK issued to Goeschel, et al., U.S. Pat. No. 5,287,617 for APPARATUS FOR EXTRACTING AN INTEGRATED CIRCUIT PACKAGE INSTALLED IN A SOCKET ON A CIRCUIT BOARD issued to Murphy, U.S. Pat. No. 4,748,495 for HIGH DENSITY MULTI-CHIP INTERCONNECTION AND COOLING PACKAGE issued to Kucharek, and U.S. Pat. No. 4,084,242 for ELECTRONIC POSTAGE WEIGHING SCALE issued to Conti.

While these recent efforts provide advantages, I note that they fail to adequately provide a mounting structure of a semiconductor device for a computer system.

SUMMARY OF THE INVENTION

It is an object of the present invention to provide a mounting structure for readily mounting or detaching a semiconductor device module to or from the motherboard of a computer system, and in addition effectively dissipating the heat generated from the chip set.

According to an embodiment of the present invention, a mounting structure for mounting a semiconductor device module in a computer system, comprises a housing for mounting a motherboard having peripheral ports for connecting with various peripheral devices, an opening formed in the housing for allowing the semiconductor device module to be mounted on or detached from the motherboard, a plurality of fasteners positioned between the motherboard and semiconductor device module for fixing the semiconductor device module on the motherboard, each of the fasteners having two end parts being respectively connected with the motherboard and semiconductor device module, and a rear bracket attached to one side of the housing for supporting the peripheral ports and additionally serving as an electromagnetic interference preventer, wherein the rear bracket further includes an extension plate placed beneath the mother board to face the part of the motherboard mounted with the semiconductor device module, and a plurality of bosses formed on the extension plate so as to respectively hold the end parts of the fasteners connected with the motherboard.

Preferably, an additional chip set is mounted on the lower surface of the motherboard so as to face the extension plate. A heat sink pad is attached to the extension plate so as to contact the chip set. Each of the fasteners includes a first fixing part connected through one of board fixing holes formed in the motherboard with the corresponding boss of the rear bracket, a second fixing part connected with one of module fixing holes formed in the semiconductor device module so as to correspond with the board fixing holes from the lower surface of the semiconductor device module, the second fixing part having a female threaded hole to receive a screw for fixing the semiconductor device module against the motherboard, and a middle support formed between the first and second fixing parts for supporting the semiconductor device module.

To achieve these and other objects in accordance with the principles of the present invention, as embodied and broadly described, the present invention provides an apparatus, comprising: a housing having a plurality of peripheral ports removably coupling with a plurality of peripheral devices; a printed circuit board being mounted to said housing, said housing forming an aperture allowing a semiconductor unit to be mounted to and detached from a first surface of said printed circuit board; a plurality of fasteners being positioned between said printed circuit board and the semiconductor unit fixing the semiconductor unit onto the first surface of said printed circuit board, each one of said fasteners having a first end part coupled with the semiconductor unit and a second end part coupled with said printed circuit board; a rear bracket being attached to a side of said housing supporting said peripheral ports and blocking electromagnetic interference; and said rear bracket including a plate extending adjacent to a second surface of said printed circuit board, said plate forming a plurality of bosses to respectively receive said second end parts of said fasteners coupling with said printed circuit board.

To achieve these and other objects in accordance with the principles of the present invention, as embodied and broadly described, the present invention provides an apparatus mounting a semiconductor unit in a computer system, comprising: a housing; a printed circuit board being mounted to said housing, said housing forming an aperture allowing the semiconductor unit to be mounted to and detached from said printed circuit board; a plurality of fasteners being positioned between said printed circuit board and the semiconductor unit fixing the semiconductor unit onto said printed circuit board, each one of said fasteners having an upper end part penetrating a respective hole formed by the semiconductor unit and a lower end part penetrating a respective hole formed by said printed circuit board; and a rear bracket being attached to a side of said housing and including a plate extending adjacent to said printed circuit board, said plate forming a plurality of bosses to respectively receive said lower end parts of said fasteners penetrating said printed circuit board.

To achieve these and other objects in accordance with the principles of the present invention, as embodied and broadly described, the present invention provides an apparatus, comprising: a housing mounting a printed circuit board, said housing forming an aperture allowing a semiconductor unit to be mounted to and detached from said printed circuit board; a plurality of fasteners being positioned between said printed circuit board and the semiconductor unit to secure the semiconductor unit to said printed circuit board, each one of said fasteners having an upper end part coupling with the semiconductor unit and a lower end part coupling with said printed circuit board; and a plate being mounted to said housing and extending adjacent to said printed circuit board, said plate forming a plurality of bosses to respectively receive said lower end parts of said fasteners.

The present invention is more specifically described in the following paragraphs by reference to the drawings attached only by way of example. Other advantages and features will become apparent from the following description and from the claims.

BRIEF DESCRIPTION OF THE ATTACHED DRAWINGS

In the accompanying drawings, which are incorporated in and constitute a part of this specification, embodiments of the invention are illustrated, which, together with a general description of the invention given above, and the detailed description given below, serve to exemplify the principles of this invention.

DETAILED DESCRIPTION OF THE PREFERRED EMBODIMENTS

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
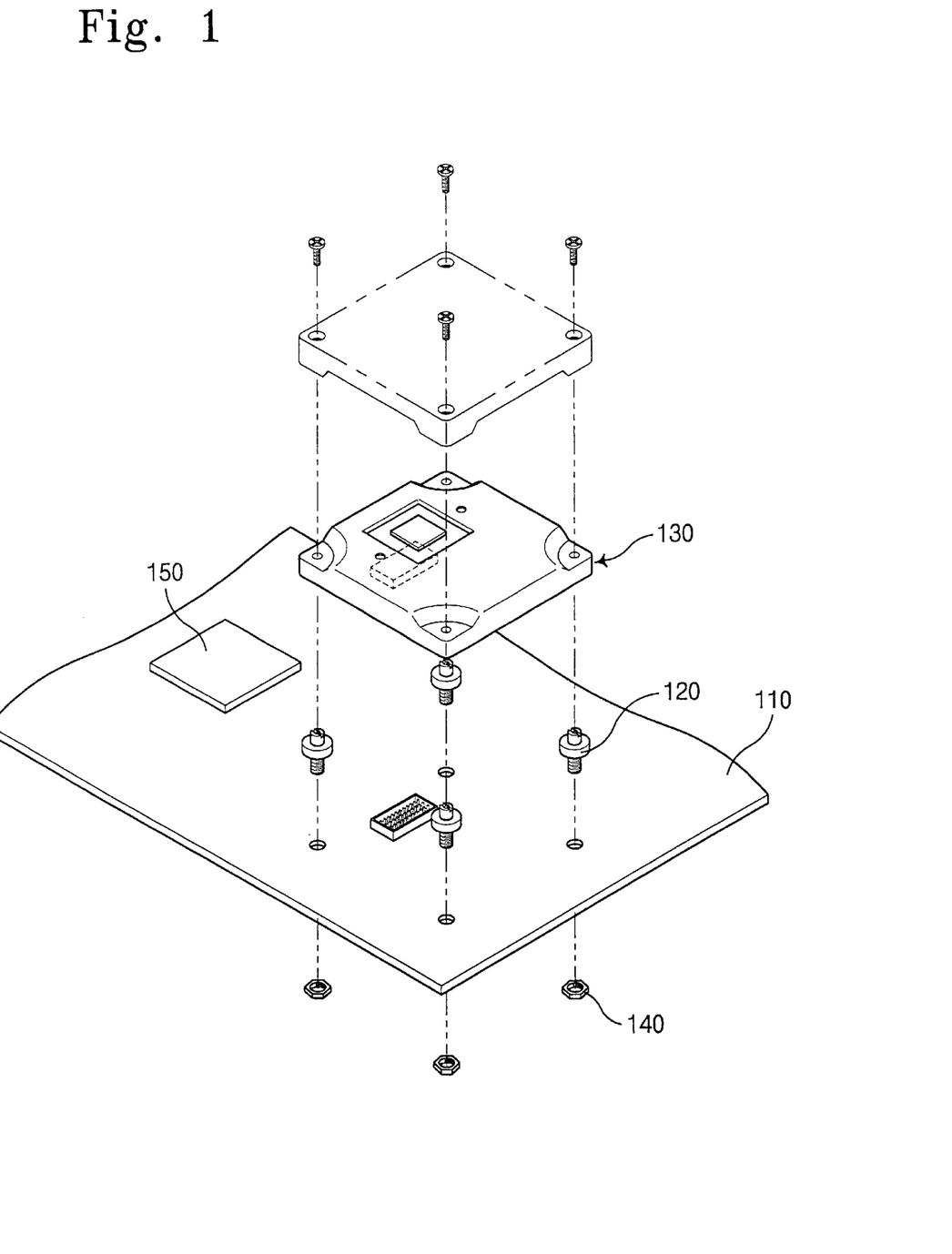
FIG. 1 is an exploded view of a mounting structure for mounting a semiconductor device module in the motherboard of a portable computer system.

Referring to FIG. 1, a semiconductor device module 130 is mounted in a motherboard 110 by means of four fasteners 120, which are respectively held by nuts 140 on the lower surface of the board 110. In this case, an additional tool is required for fixing the nuts 140 to the fasteners 120, risking the lower surface ofthe motherboard to injury. In addition, such mounting procedure makes the assembling of the parts difficult. Further, an additional heat drain structure (not shown) is required to dissipate the heat generated from the chip set 150, for example, 440 BX CHIP, mounted near the semiconductor device module 130.

The same reference numerals are used throughout the attached drawings to represent same functional parts. Referring to FIGS. 2 to 4C, there are shown a semiconductor device module 20, chip set 18, motherboard 14, rear bracket 40, fasteners and heat sink member 60. The computer system 10 includes a display panel (not shown) hinged to a system body 12. The system body 12 includes a bottom housing part 12b and top housing part 12a enclosing the motherboard 14, electronic card assemblies (not shown), the semiconductor device module 20 and the rear bracket 40. A keyboard 50 is mounted on a keyboard seat 13 formed on the upper surface of the system body 12. The keyboard seat 13 is provided with an opening 13a through which the semiconductor device module 20 is mounted on the motherboard 14. To this end, it is desirable that the part of the motherboard 14 on which the semiconductor device module 20 is positioned so as to face the opening 13a.

Figure 2:
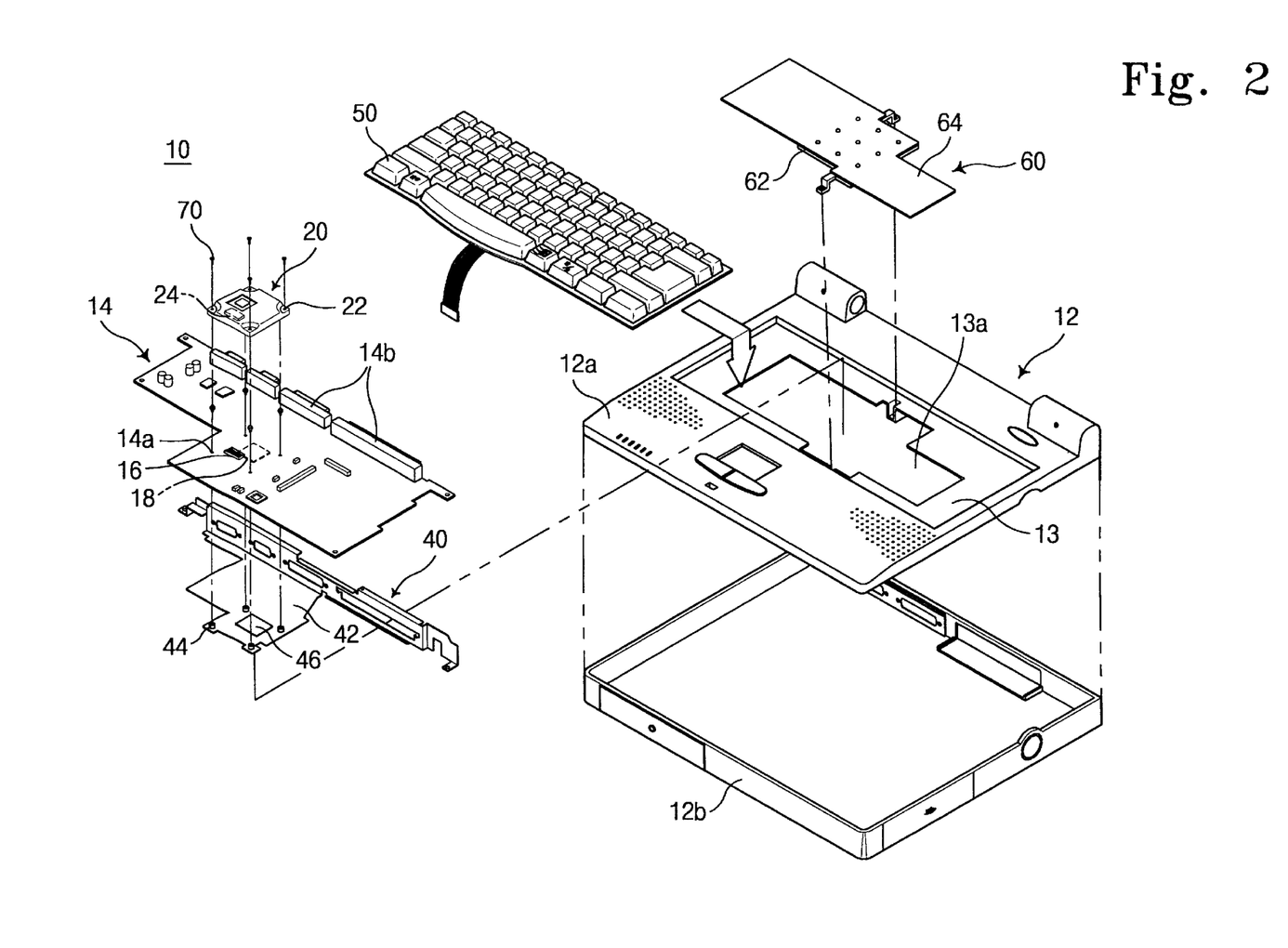
FIG. 2 is an exploded view of a portable computer system, in accordance with the principles of the present invention.
Figure 3:
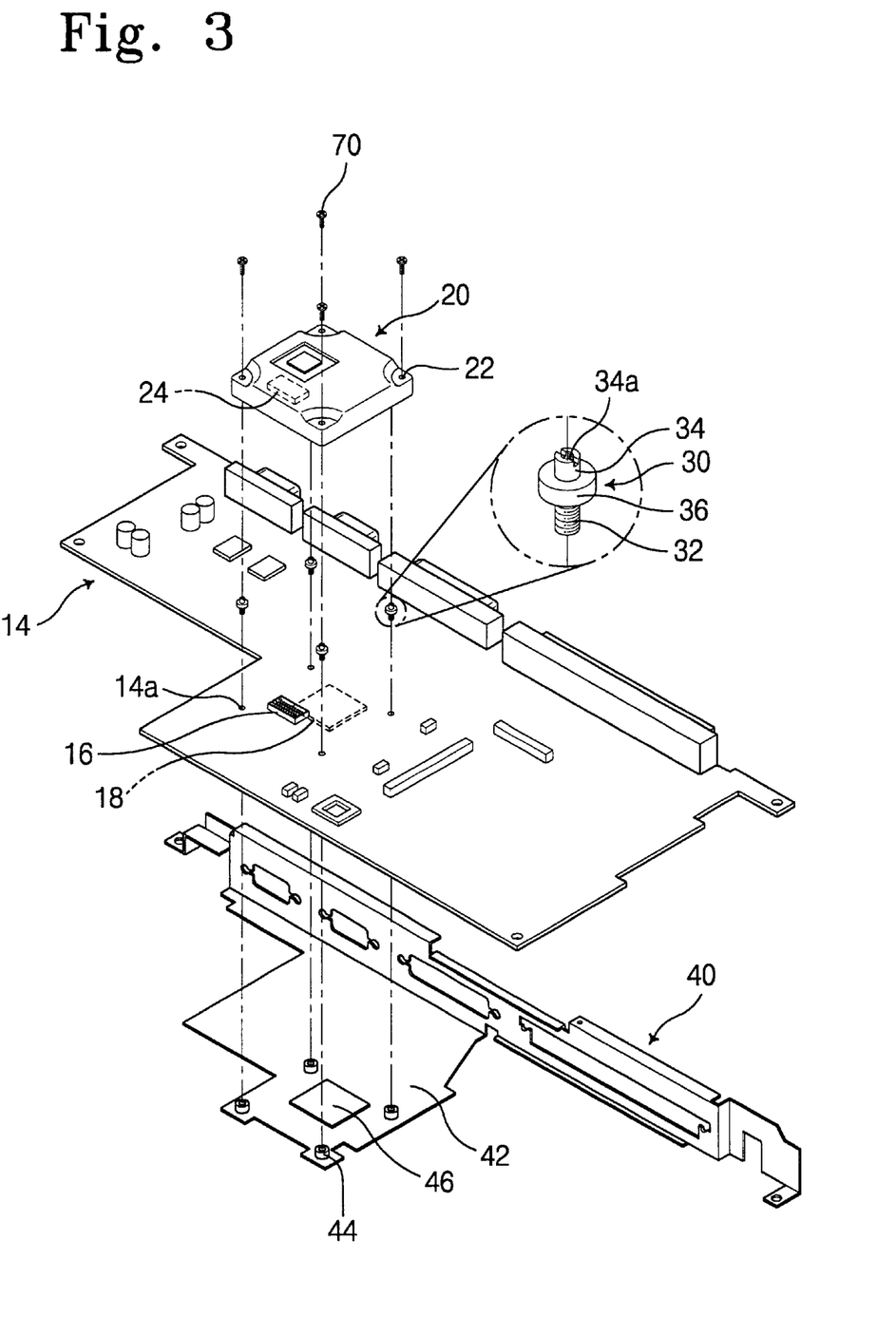
FIG. 3 is an enlarged perspective view for illustrating parts of FIG. 2 related to the mounting structure of a semiconductor device module, in accordance with the principles of the present invention.

Referring to FIG. 3, every corner of the semiconductor device module 20 is provided with a first hole 22, and the lower surface of the module 20 with a first connector 24. The motherboard 14 is provided with a second connector 16 connected with the first connector 24, and second holes 14a corresponding with the first holes 22. The chip set 18 is mounted on the lower surface of the motherboard 14 so as to be opposed to the module 20. The fasteners 30 are used to fix the semiconductor device module 20 to the motherboard 14. Each of the fasteners 30 is cylindrically shaped to have a first fixing part 32, second fixing part 34 and middle support 36, as shown in FIG. 3. The first fixing part 32 of the fastener 30 is passed through the second hole 14a of the motherboard 14, fixed into a boss 44 formed in the rear bracket 40 below the motherboard 20, as shown in FIGS. 2 and 3. On the contrary, the second fixing part 34 positioned opposite to the first fixing part 32 is inserted upwardly into the first hole 22 of the semiconductor device module 20. The upper end of the second fixing part 34 is provided with a female threaded hole 34a with which the screw 70 is engaged through the first hole 22 of the semiconductor device module 20. In addition, the end of the second fixing part 34 is provided with a central slot to receive the tip of a screwdriver, by which the fastener 30 may be fixed or released to or from the boss 44 of the rear bracket 40. The middle support 36 is laterally protruded between the first fixing part 32 and second fixing part 34 so as to support the semiconductor device module 20 with a space from the motherboard 14.

The rear bracket 40 is attached on one side of the bottom housing part 12b to support a plurality of peripheral ports 14b installed on the motherboard 14 connected with various peripheral devices. Preferably, one side of the rear bracket 40 is exposed to the outside of the bottom housing part so as to prevent electromagnetic interferences and dissipate the heat generated from the chip set 18. The rear bracket 40 has an extension plate 42 placed beneath the motherboard to face the chip set 18. The bosses 44 are formed on the extension plate 42 so as to respectively hold the end parts of the first fixing parts 32 of the fasteners 30. The extension plate 42 has a heat sink pad 46 facing the chip set 18 in order to effectively drain the heat of the chip set 18 through the rear bracket 40.

Figure 4A:
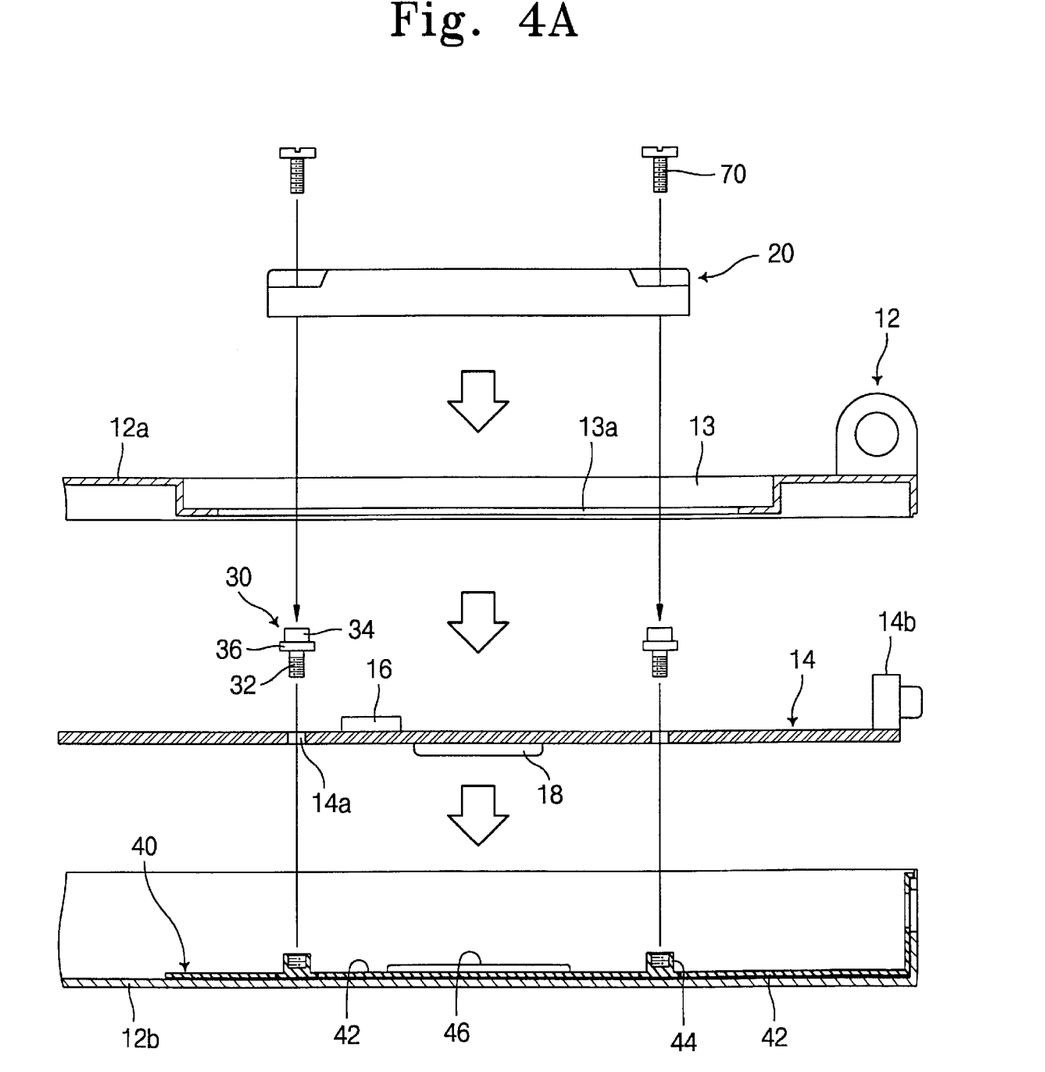
FIGS. 4A to 4C are the cross sectional views of the system body for illustrating the procedure of mounting a semiconductor device module, in accordance with the principles of the present invention.
Figure 4B:
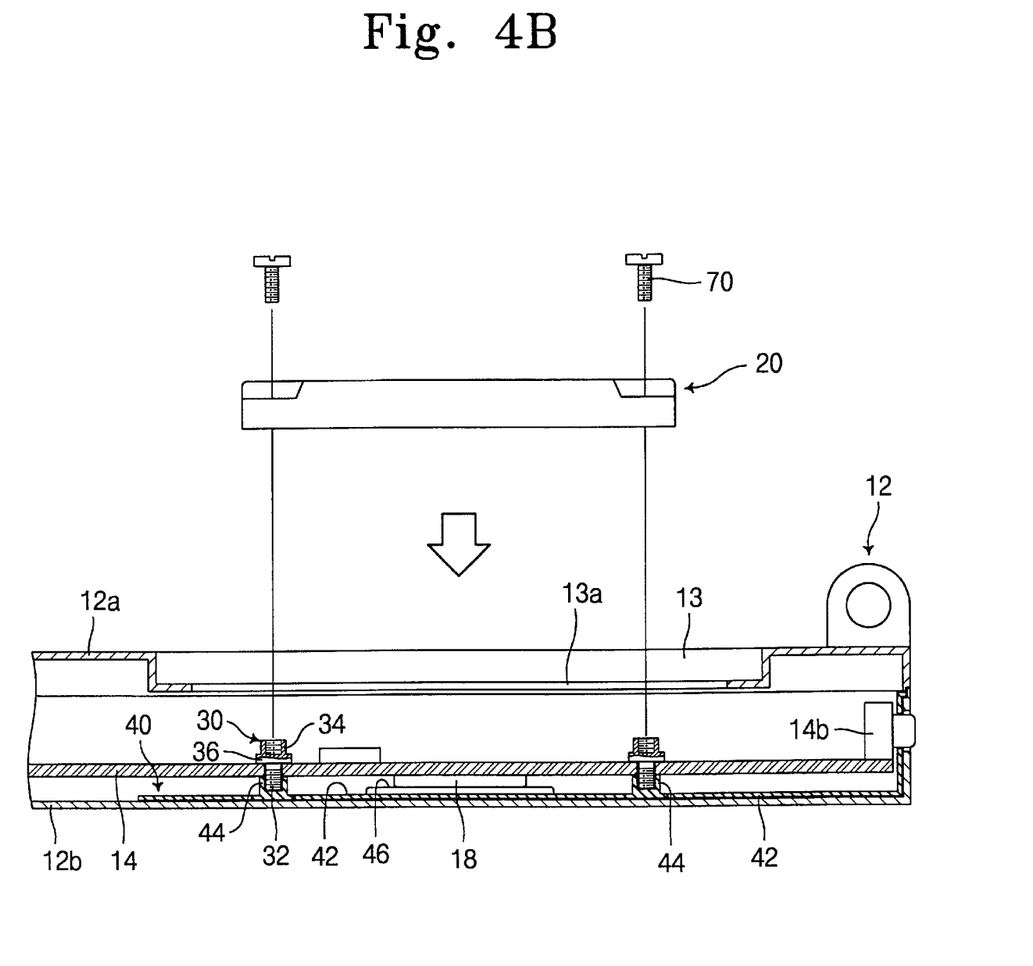
Figure 4C:
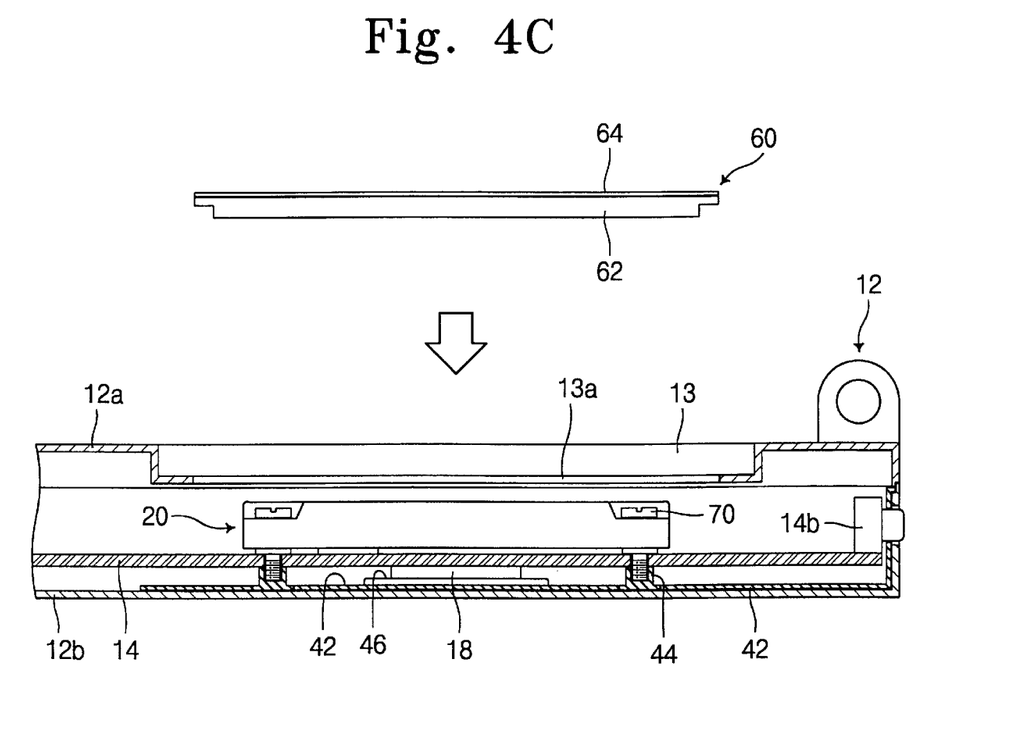
Figure 5:
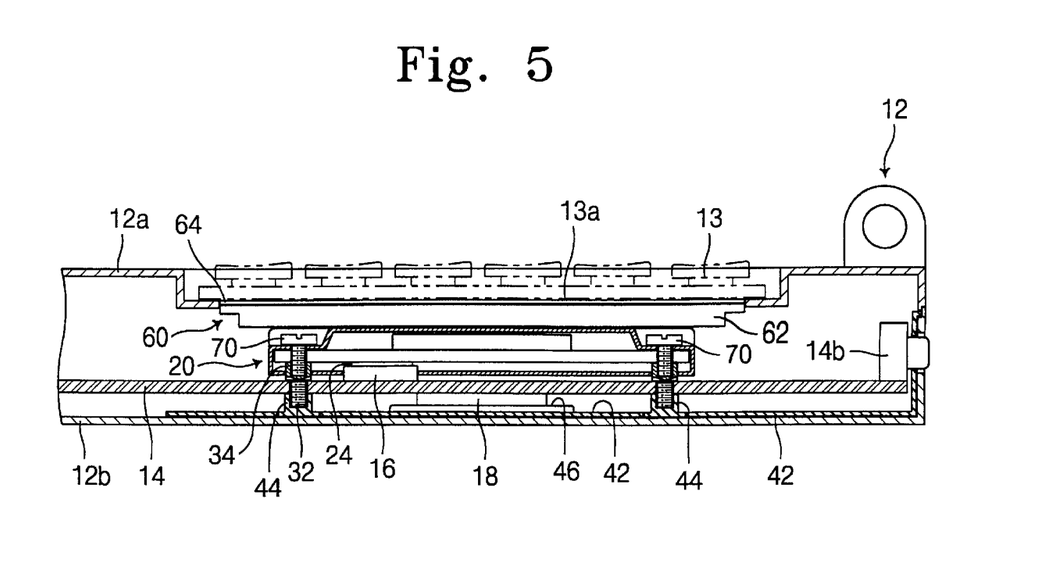
FIG. 5 is a cross sectional view of the system body for illustrating a semiconductor device module completely mounted on the motherboard, in accordance with the principles of the present invention.

Describing the procedure of mounting the semiconductor device module on the motherboard in connection with FIGS. 4A to 5, the rearbracket 40 is firstly mounted on the bottom and side of the bottom housing part 12b. The motherboard 14 is attached to the extension part 42 with screw 70, so that the chip set 18 mounted on the lower surface of the motherboard is contacted with the heat sink pad 46, as shown in FIG. 4b. Thus, the heat of the chip set 18 is dissipated through the heat sink pad 46 to the rear bracket 40 to the outside of the housing. After mounting the top housing part 12a on the bottom housing part 12b, the first fixing parts 32 of the fasteners 30 are inserted through the second holes 14a of the motherboard 14, fixed into the respective bosses 44 of the extension part 42. The first connector 24 of the semiconductor device module 20 is electrically connected with the second connector 16 of the motherboard 14. In this case, the second fixing parts 34 of the fasteners 30 are inserted into the respective first holes 22 of the semiconductor device module 20. The middle supports 36 of the fasteners 30 support the lower surface of the module 20.

Finally, the screws 70 are engaged with the female threaded holes 34a of the second fixing parts 34 through the first holes 22 of the semiconductor device module 20, completing the mounting procedure as shown in FIG. 4C. As shown in FIG. 5, the heat sink member 60 includes a heat sink 62 contacting the upper surface of the semiconductor device module 20 and a heat dissipation plate 64 contacting the detachable keyboard 50.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures maybe made from such details without departing from the spirit or scope of the applicant's general inventive concept.

What is claimed is:

1. An apparatus, comprising:
a housing having a plurality of peripheral ports removably coupling with a plurality of peripheral devices;
a printed circuit board being mounted to said housing, said housing forming an aperture allowing a semiconductor unit to be mounted to and detached from a first surface of said printed circuit board;
a plurality of fasteners being positioned between said printed circuit board and the semiconductor unit fixing the semiconductor unit onto the first surface of said printed circuit board, each one of said fasteners having a first end part coupled with the semiconductor unit and a second end part coupled with said printed circuit board;
a rear bracket being attached to a side of said housing supporting said peripheral ports and blocking electromagnetic interference; and
said rear bracket including a plate extending adjacent to a second surface of said printed circuit board, said plate forming a plurality of bosses to respectively receive said second end parts of said fasteners coupling with said printed circuit board.

2. The apparatus ofclain 1, further comprising said housing corresponding to a housing for a computer system.

3. The apparatus of claim 2, further comprising said printed circuit board corresponding to a motherboard and the semiconductor unit corresponding to a central processing unit controlling the computer system.

4. The apparatus of claim 1, the first and second surfaces of said printed circuit board corresponding to upper and lower surfaces respectively.

5. The apparatus of claim 1, further comprising a chip set being mounted on the second surface of said printed circuit board adjacent to said plate, said plate dissipating heat generated by said chip set away from said chip set through said plate and toward an exterior of said housing.

6. The apparatus of claim 5, further comprising a heat sink pad being attached to said plate and contacting said chip set, said heat sink pad transferring the heat generated by said chip set to said plate.

7. The apparatus of claim 1, each one of said plurality of fasteners further comprising:
a first fixing part coupling with a first one of a plurality of board fixing holes formed in said printed circuit board and being received by a corresponding boss selected from among said plurality of bosses of said plate;
a second fixing part coupling with a first one of a plurality of module fixing holes formed in the semiconductor unit, said second fixing part having a female threaded hole receiving a screw fixing the semiconductor unit to said printed circuit board; and
a middle support being formed between said first and second fixing parts supporting the semiconductor unit.

8. The apparatus of claim 7, further comprising the first board fixing hole being aligned with the first module fixing hole.

9. The apparatus of claim 7, each one of said plurality of bosses including a female threaded hole receiving a first fixing part of a corresponding fastener, the first fixing part including a threaded male part engaging with the female threaded hole of the boss.

10. An apparatus mounting a semiconductor unit in a computer system, comprising:
a housing;
a printed circuit board being mounted to said housing, said housing forming an aperture allowing the semiconductor unit to be mounted to and detached from said printed circuit board;

a plurality of fasteners being positioned between said printed circuit board and the semiconductor unit fixing the semiconductor unit onto said printed circuit board, each one of said fasteners having an upper end part penetrating a respective hole formed by the semiconductor unit and a lower end part penetrating a respective hole formed by said printed circuit board; and a rear bracket being attached to a side of said housing and including a plate extending adjacent to said printed circuit board, said plate forming a plurality of bosses to respectively receive said lower end parts of said fasteners penetrating said printed circuit board.

11. The apparatus of claim 10, said housing further comprising a plurality of peripheral ports removably coupling with a plurality of peripheral devices.

12. The apparatus of claim 11, said rear bracket supporting said peripheral ports.

13. The apparatus of claim 12, said rear bracket blocking electromagnetic interference.

14. The apparatus of claim 13, further comprising said printed circuit board corresponding to a motherboard and the semiconductor unit corresponding to a central processing unit controlling the computer system.

15. The apparatus of claim 13, further comprising said printed circuit board having an upper side facing the semiconductor unit and a lower side facing said plate.

16. The apparatus of claim 15, firther comprising a chip set being mounted on the lower surface of said printed circuit board adjacent to said plate, said plate dissipating heat generated by said chip set away from said chip set through said plate and toward said plurality of peripheral ports of said rear bracket.

17. An apparatus, comprising:

a housing mounting a printed circuit board, said housing forming an aperture allowing a semiconductor unit to be mounted to and detached from said printed circuit board;

a plurality of fasteners being positioned between said printed circuit board and the semiconductor unit to secure the semiconductor unit to said printed circuit board, each one of said fasteners having an upper end part coupling with the semiconductor unit and a lower end part coupling with said printed circuit board; and a bracket being coupled to said housing, said bracket having a plate said plate, extending outwardly from said bracket, said plate being adjacent to said printed circuit board, said plate forming a plurality of bosses to respectively receive said lower end parts of said fasteners.

18. The apparatus of claim 17, further comprising a chip set being mounted on said printed circuit board adjacent to said plate, said plate dissipating heat generated by said chip set away from said chip set through said plate and toward an exterior of said housing.

19. The apparatus of claim 18, further comprising a heat sink pad being attached to said plate and contacting said chip set, said heat sink pad transferring the heat generated by said chip set to said plate.

20. The apparatus of claim 19, each one of said plurality of fasteners further comprising:

a first fixing part of said lower end part coupling with a first one of a plurality of board fixing holes formed in said printed circuit board and being received by a corresponding boss selected from among said plurality of bosses of said plate;

a second fixing part of said upper end part coupling with a first one of a plurality of module fixing holes formed in the semiconductor unit, said second fixing part having a female threaded hole receiving a screw fixing the semiconductor unit to said printed circuit board; and a middle support being formed between said first and second fixing parts supporting the semiconductor unit.

* * * * *